United States Patent
Gardner et al.

[19]

[11] Patent Number: 6,048,803
[45] Date of Patent: Apr. 11, 2000

[54] METHOD OF FABRICATING A SEMICONDUCTOR DEVICE HAVING FLUORINE BEARING OXIDE BETWEEN CONDUCTIVE LINES

[75] Inventors: Mark I. Gardner, Cedar Creek; Daniel Kadosh, Austin, both of Tex.

[73] Assignee: Advanced MicroDevices, Inc., Sunnyvale, Calif.

[21] Appl. No.: 08/914,658

[22] Filed: Aug. 19, 1997

[51] Int. Cl.⁷ .................................................. H01L 21/441
[52] U.S. Cl. .......................... 438/783; 438/782; 257/347; 257/348
[58] Field of Search ................... 438/783, 622, 438/782; 257/347, 348

[56] References Cited

U.S. PATENT DOCUMENTS

| | | |
|---|---|---|
| 4,814,285 | 3/1989 | Matlock et al. . |
| 4,843,034 | 6/1989 | Herndon et al. . |
| 4,946,550 | 8/1990 | Van Laarhoven . |
| 5,429,995 | 7/1995 | Nishiyama et al. . |
| 5,459,086 | 10/1995 | Yang ......................................... 437/35 |
| 5,486,493 | 1/1996 | Jeng . |
| 5,496,776 | 3/1996 | Chien et al. . |
| 5,514,624 | 5/1996 | Morozumi . |
| 5,527,737 | 6/1996 | Jeng . |
| 5,534,731 | 7/1996 | Cheung . |
| 5,565,384 | 10/1996 | Havemann . |
| 5,578,531 | 11/1996 | Kodera et al. . |
| 5,591,676 | 1/1997 | Hughes et al. . |
| 5,607,880 | 3/1997 | Suzuki et al. ........................... 437/195 |
| 5,641,581 | 6/1997 | Nishiyama et al. . |
| 5,661,334 | 8/1997 | Akram . |
| 5,661,344 | 8/1997 | Havemann et al. . |
| 5,674,784 | 10/1997 | Jang et al. . |
| 5,708,303 | 1/1998 | Jeng . |
| 5,714,788 | 2/1998 | Ngaoaram . |
| 5,728,628 | 3/1998 | Havemann . |
| 5,763,010 | 6/1998 | Guo et al. ............................. 427/376.2 |
| 5,789,819 | 8/1998 | Gnade et al. . |
| 5,811,352 | 9/1998 | Numata et al. .......................... 438/622 |
| 5,821,585 | 10/1998 | Maegawa . |
| 5,821,621 | 10/1998 | Jeng . |
| 5,858,869 | 1/1999 | Chen et al. .............................. 438/597 |
| 5,877,080 | 3/1999 | Aoi et al. . |

OTHER PUBLICATIONS

S. Wolf, *Silicon Processing for the VLSI Era—volume II*, pp. 188–217; 240–260; and 334–337, copyright 1990.

*Primary Examiner*—Charles Bowers
*Assistant Examiner*—Martin Sulsky

[57] ABSTRACT

A semiconductor device having relatively low permittivity fluorine bearing oxide between conductive lines and a method for fabricating such a device is provided. At least two adjacent conductive lines are formed over a substrate. An oxide layer is formed between the adjacent conductive lines. A mask is formed over the oxide layer and selectively removed to expose a portion of the oxide layer between the adjacent conductive lines. A fluorine bearing species is implanted into the exposed portion of the oxide layer to reduce the permittivity of the oxide layer between the adjacent conductive lines. The permittivity or dielectric constant of the oxide layer between the adjacent conductive lines can, for example, be reduced from about 3.9 to 4.2 to about 3.0 to 3.5.

20 Claims, 2 Drawing Sheets

METHOD OF FABRICATING A SEMICONDUCTOR DEVICE HAVING FLUORINE BEARING OXIDE BETWEEN CONDUCTIVE LINES

FIELD OF THE INVENTION

The present invention is directed generally to semiconductor devices and, more particularly, to a semiconductor device having low permittivity fluorine bearing oxide between conductive lines and a method of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

A typical semiconductor substrate includes a large number of transistors which are interconnected using one or more layers of metal. FIG. 1 illustrates an exemplary multilevel-interconnect structure for MOS technologies. The interconnect structure illustrated in FIG. 1 includes two metal layers 101 and 102. Each of the metal layers 101 and 102 include a plurality of metal lines 109. The first metal layer 101 generally interconnects active portions of the transistors, such as the gate electrode 105 and the source/drain region 104. Each subsequent metal layer, such as second metal layer 102, typically interconnects regions of the previously formed metal layer. Dielectric layers 106 and 107 are provided between conductive structures, such as the metal layers 101 and 102, the gate electrode 105, and the source/drain region 104 in order to isolate these structures from one another. Openings or vias 108 in the dielectric layers 106 and 107 are used to interconnect these conductive structures as desired. A more detailed description of metal layers and the fabrication thereof may be found in S. Wolf, *Silicon Processing for the VLSI Era,* Vol. 2: Processing Integration, pp. 188–217, 240–260 and 334–337.

One important characteristic of the dielectric layers in an interconnect structure is that they have a low dielectric constant in order to keep capacitance between conductive structures to a minimum. It should be appreciated that high capacitance between conductive structures can deleteriously affect the speed of a semiconductor device. At present, oxides having dielectric constants (permittivity) ranging from about 3.9 to 4.2 are used to form dielectric layers between conductive structures of a semiconductor device.

SUMMARY OF THE INVENTION

Generally, the present invention relates to a semiconductor device having relatively low permittivity fluorine bearing oxide between conductive lines and a method for fabricating such a device.

In accordance with one embodiment of the invention, a semiconductor fabrication process is provided. At least two adjacent conductive lines are formed over a substrate. An oxide layer is formed between the adjacent conductive lines. A mask is formed over the oxide layer and selectively removed to expose at least a portion of the oxide layer between the adjacent conductive lines. A fluorine bearing species is implanted into the exposed portion of the oxide layer to form a fluorine bearing oxide between the conductive lines and reduce the permittivity of the oxide layer between the adjacent conductive lines. The permittivity of the oxide layer between the adjacent conductive lines can, for example, be reduced from 3.9 to 4.2 to about 3.0 to 3.5.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
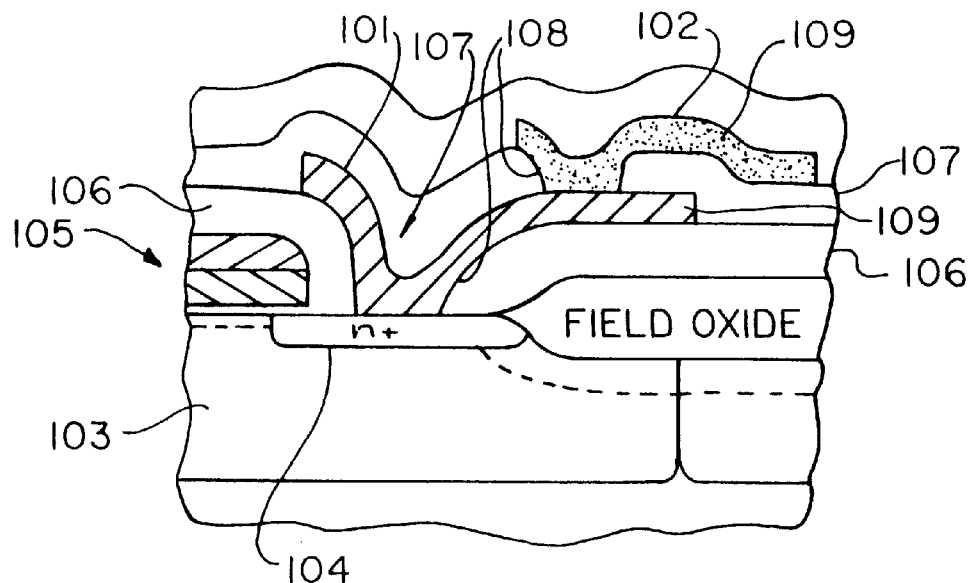
FIG. 1 illustrates an exemplary multilevel-interconnect structure for a MOS semiconductor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention generally provides a semiconductor device and method of forming a semiconductor device having a relatively low permittivity fluorine bearing oxide between conductive lines. The present invention is applicable to a number of semiconductor devices including, for example, MOS, CMOS, bipolar and BiCMOS transistors. While the present invention is not limited to such devices, an appreciation of various aspects of the invention will be gained through a discussion of various fabrication processes and device characteristics in connection with the examples provided below.

As noted above, semiconductor devices are typically comprised of one or more conductive layers, such as metal layers, each of which include a number of conductive lines for forming an integrated circuit. The relative significance of capacitance between conductive lines of different conductive layers ("vertical capacitance") and the capacitance between adjacent conductive lines of the same conductive layer ("horizontal capacitance") can vary between semiconductor devices. For example, in some semiconductor devices, one type of capacitance may have more predominant effect on device performance than the other. In other devices, horizontal and vertical capacitance may both have a substantial impact on device performance. In the embodiments discussed below, there will be illustrated techniques for reducing horizontal capacitance.

Figure 2A:
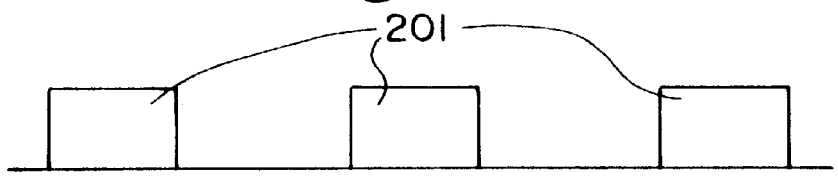
FIGS. 2A–2E illustrate an exemplary process for forming a semiconductor device in accordance one embodiment of the present invention.

FIGS. 2A–2E illustrate a fabrication process for providing relatively low permittivity material between conductive lines of the same conductive layer. In accordance with this embodiment, conductive lines 201 are formed over a substrate (not shown), usually a silicon substrate. The resultant structure is illustrated in FIG. 2A. The conductive lines 201 may be formed directly on top of the substrate or on top of a dielectric insulating material.

Typically, the conductive lines 201 are formed of a metal, such as tungsten or aluminum. However, the invention is not so limited. Other conductive material, including, for example, doped polysilicon, may be used to form the conductive lines 201. The conductive lines 201 may be formed by depositing a layer of conductive material and selectively removing the conductive layer to form the conductive lines 201 using, for example, well-known deposition and etching techniques. The thickness of the conductive lines can vary with design parameters. Exemplary thicknesses range from about 2000 to 5000 angstroms (Å), for example.

Figure 2B:
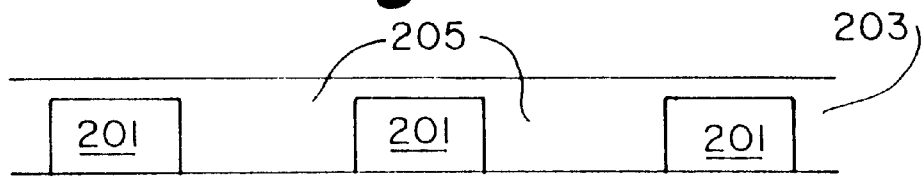

An oxide layer 203, such as $SiO_2$, is formed over and between the conductive lines 201. The oxide layer 203 may be formed using, for example, well-known deposition techniques and may be planarized if desired. The resultant structure is illustrated in FIG. 2B. In conventional processes, an oxide layer alone is typically used as a dielectric to separate conductive lines. As will be discussed further below, consistent with the present invention, regions 205 of the oxide layer 203 between adjacent conductive lines 201 will be implanted with a fluorine bearing species in order to reduce the permittivity of the oxide layer 203 in these regions 205 and enhance device performance.

Figure 2C:
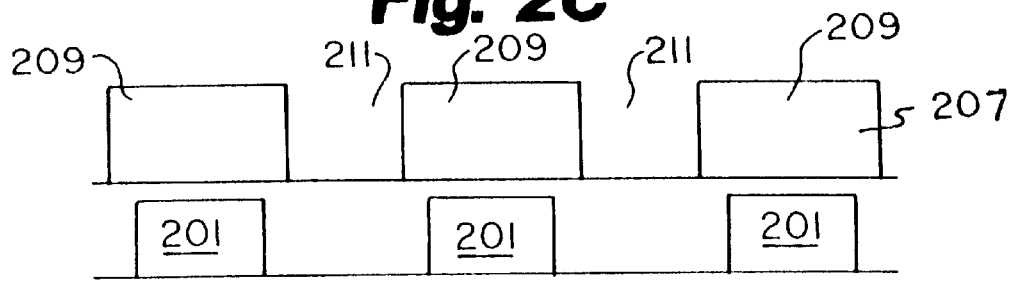

A masking layer 207 is formed over the oxide layer 203 and selectively removed to expose portions of the oxide layer 203 between adjacent conductive lines 201. The resultant structure is illustrated in FIG. 2C. Formation and selective removal of the masking layer 207 may be performed using well-known photolithography techniques. The remaining portions 209 of the masking layer 207 typically cover the conductive lines 201, while the openings 211 in the masking layer 207 expose portions of the oxide layer between conductive lines 203. The openings 211 are typically sized and positioned such that the fluorine bearing species, which will be implanted, does not come in contact with the conductive lines 201 during the implant or processing subsequent thereto (e.g., formation of subsequent metal layers and the heat treatment associated therewith). The thickness of the masking layer 205 is selected in consideration of the energy levels of the subsequent fluorine implant. Masking layer thickness of 20,000 to 50,000 Å would be suitable for many applications.

Figure 2D:
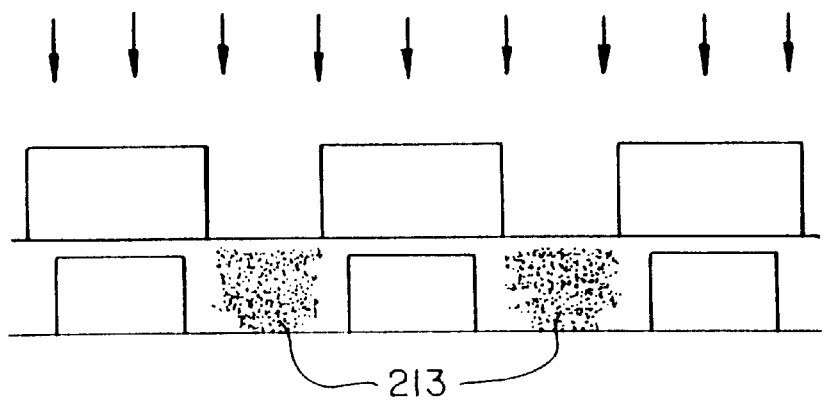

The exposed portions of the oxide layer 203 are implanted with a fluorine bearing species, such as $F_2$ or $^{19}F$, to provide fluorine in regions 213 of the oxide layer 203 separating adjacent conductive lines 201. The resultant structure is illustrated in FIG. 2D. The incorporation of fluorine in the oxide layer 203 reduces the permittivity or dielectric constant of the oxide layer in these regions 213. The permittivity of the oxide layer 203 in the fluorine-bearing regions 213 can, for example, be reduced from 3.9 to 4.2 to about 3.0 to 3.5 by way of the fluorine incorporation. The fluorine implant typically is sufficiently deep to substantially place the fluorine away from the top surface of the oxide layer 203. The fluorine bearing species may be activated during a subsequent heat treatment, e.g., during the formation of a subsequent conductive layer.

Dosages of the fluorine bearing species ranging from about 5E14 to 5E15 atoms/cm² would be sufficient for many applications. The number of implantations as well as the implant energies can vary with the thickness of the conductive lines/oxide layer. Typically, with relatively thick conductive lines (e.g., above 3000 angstroms), multiple fluorine implants are used. With thinner conductive lines, a single fluorine implant may be sufficient. The implant energies can also vary with the type of fluorine bearing species being implanted. $^{19}F$, for example, has a higher ability to penetrate oxide for a given energy level as compared to $F_2$. $^{19}F$ implant energies ranging from 200 KeV to 2 MeV would be suitable for many applications.

Figure 2E:
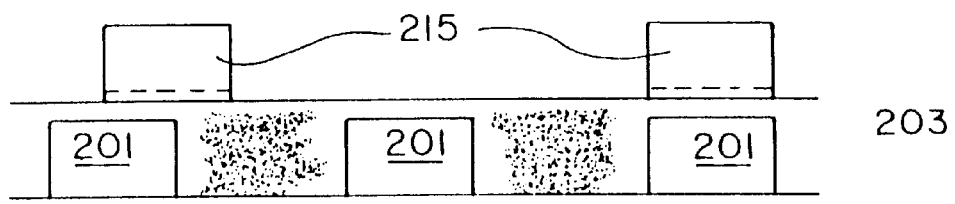

Fabrication may continue with the formation of a subsequent conductive layer or, where the conductive lines 201 represent the final conductive layer, a passivation layer, such as an oxide like $SiO_2$, may be formed over the substrate to insulate the semiconductor device. Formation of a subsequent conductive layer is illustrated in FIG. 2E. In general, a conductive layer is formed over the oxide layer and selectively removed to form conductive lines 215. This may be done using well-known techniques in a similar manner as discussed above with respect to FIG. 2A. The process described with respect to FIGS. 2A–2D may be repeated to form a low permittivity fluorine bearing oxide between the conductive lines 215.

The second conductive lines 215 may be formed directly on top of the oxide layer 203 if the fluorine bearing species is implanted sufficiently deep to avoid substantially incorporation of fluorine near the top surface of the oxide layer 203. Optionally, a thin insulating layer, such as an oxide, may be formed between the conductive lines 215 and the oxide layer 203 to further insulate the conductive lines 215 from fluorine. As noted above, the heat treatment associated with a subsequent conductive layer may be used to activate the fluorine in the oxide layer. Optionally, a heating step may be specifically introduced for such activation.

Using the above process, a relatively low permittivity fluorine bearing oxide can be disposed between adjacent conductive lines of a conductive layer. In this manner, the capacitance between conductive lines of a semiconductor device can be reduced as compared to conventional semiconductor devices using higher permittivity materials, such as non-fluorine bearing oxide, to insulate adjacent conductive lines. This significantly enhances device performance by, for example, increasing the operating speed of the device.

As noted above, the present invention provides a semiconductor device and a method of fabricating a semiconductor device having relatively low permittivity fluorine bearing oxide between conductive lines. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of forming a semiconductor device, comprising:

forming at least two adjacent conductive lines over a substrate;

forming an oxide layer between the adjacent conductive lines;

forming a mask over the oxide layer;

selectively removing portions of the mask to expose at least a portion of the oxide layer between the adjacent conductive lines;

implanting a fluorine bearing species into the exposed portion of the oxide layer to reduce the permittivity of the oxide layer between the adjacent conductive lines.

2. The process of claim 1, wherein forming the adjacent conductive lines includes:

forming a conductive layer over the substrate; and selectively removing portions of the conductive layer.

3. The process of claim 1, wherein forming the oxide layer includes depositing the oxide layer.

4. The process of claim 1, wherein the oxide layer is formed from silicon dioxide.

5. The process of claim 1, wherein the mask is formed from a photoresist.

6. The process of claim 5, wherein selectively removing portions of the mask includes etching the photoresist.

7. The process of claim 1, wherein the fluorine bearing species includes $^{19}$F.

8. The process of claim 1, wherein implanting the fluorine bearing species includes performing multiple implants of fluorine bearing species.

9. The process of claim 1, wherein implanting the fluorine bearing species is performed at one or more energy levels ranging from 200 KeV to 2 MeV.

10. The process of claim 1, wherein the permittivity of the oxide layer is reduced to about 3.0 to 3.5.

11. The process of claim 1, wherein the removed portions of the mask are sized such that the implanted fluorine bearing species is spaced apart from the conductive lines.

12. The process of claim 11, wherein remaining portions of the mask overlap a portion of the oxide layer between the conductive lines.

13. The process of claim 1, wherein the fluorine bearing species is implanted at a dosage ranging from about 5E14 to 5E15 atoms/cm$^2$.

14. The process of claim 1, wherein the conductive lines have a depth ranging from about 2000 to 5000 Å.

15. The process of claim 14, wherein implanting the fluorine bearing species includes performing multiple implants of fluorine bearing species.

16. The process of claim 1, further including removing the mask after implanting the fluorine bearing species and forming a conductive layer over the oxide layer.

17. The process of claim 1, further including forming a thin insulating layer over the oxide layer prior to forming a second conductive layer on the thin insulating layer.

18. The process of claim 1, further including heating the substrate after implanting the fluorine bearing species.

19. A process of forming a semiconductor device, comprising:

depositing a metal layer over a substrate;

selectively etching portions of the metal layer to form a plurality of metal lines;

depositing an oxide layer between adjacent metal lines;

forming a photoresist mask over the oxide layer;

opening portions of the photoresist mask to expose portions of the oxide layer between adjacent metal lines;

implanting a fluorine bearing species into the exposed portions of the oxide layer to reduce the permittivity of the oxide layer between adjacent metal lines.

20. The process of claim 18, wherein the permittivity of the oxide layer is reduced to about 3.0 to 3.5.

* * * * *